(12) United States Patent
Weingarten et al.

(10) Patent No.: US 8,588,003 B1
(45) Date of Patent: Nov. 19, 2013

(54) SYSTEM, METHOD AND COMPUTER PROGRAM PRODUCT FOR PROGRAMMING AND FOR RECOVERING FROM A POWER FAILURE

(75) Inventors: Hanan Weingarten, Herzelia (IL); Avigdor Segal, Netanya (IL)

(73) Assignee: Densbits Technologies Ltd., Haifa (IL)

( * ) Notice: Subject to any disclaimer, the term of this patent is extended or adjusted under 35 U.S.C. 154(b) by 71 days.

(21) Appl. No.: 13/434,334

(22) Filed: Mar. 29, 2012

Related U.S. Application Data

(60) Provisional application No. 61/513,937, filed on Aug. 1, 2011.

(51) Int. Cl.
  *G11C 16/00*  (2006.01)
(52) U.S. Cl.
  USPC ............ 365/185.18; 365/185.02; 365/185.03; 365/185.09
(58) Field of Classification Search
  USPC .................................................. 365/185.02
  See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,353,553 B1 * | 3/2002 | Tamada et al. | ........... 365/185.03 |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |

(Continued)

*Primary Examiner* — Tan T. Nguyen
(74) *Attorney, Agent, or Firm* — Dentons US LLP

(57) ABSTRACT

A method, system and a computer readable medium, the method may include programming multiple logical pages to a flash memory module according to a programming order; calculating a XOR value for each group of logical pages; storing the XOR value of each group of logical pages; and using a XOR value of a group of logical pages to reconstruct a corrupted logical page of the group of logical pages; wherein up to a single logical page of each group of logical pages is programmed to a each row of a flash memory die; and wherein logical page numbers of logical pages of a same type that belong to different groups of logical pages belong to non-overlapping numerical ranges.

33 Claims, 13 Drawing Sheets

(56) References Cited

U.S. PATENT DOCUMENTS

| | | |
|---|---|---|
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 7,990,765 B2* | 8/2011 | Park et al. .............. 365/185.03 |
| 8,020,073 B2 | 9/2011 | Emma et al. |
| 8,122,328 B2 | 2/2012 | Liu et al. |
| 8,498,152 B2* | 7/2013 | Alrod et al. ............. 365/185.03 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |

(56) References Cited

U.S. PATENT DOCUMENTS

| | | |
|---|---|---|
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

\* cited by examiner

| Row | LSB | CSB | MSB |
|---|---|---|---|
| 1 | 0 | 2 | 5 |
| 2 | 1 | 4 | 8 |
| 3 | 3 | 7 | 11 |
| 4 | 6 | 10 | 14 |
| 5 | 9 | 13 | 17 |
| 6 | 12 | 16 | 20 |
| 7 | 15 | 19 | 23 |
| 8 | 18 | 22 | 26 |
| 9 | 21 | 25 | 29 |
| 10 | 24 | 28 | 32 |
| 11 | 27 | 31 | 35 |
| 12 | 30 | 34 | 38 |
| 13 | 33 | 37 | 41 |
| 14 | 36 | 40 | 44 |
| 15 | 39 | 43 | 47 |
| 16 | 42 | 46 | 50 |
| 17 | 45 | 49 | 53 |
| 18 | 48 | 52 | 56 |
| 19 | 51 | 55 | 59 |
| 20 | 54 | 58 | 62 |
| 21 | 57 | 61 | 65 |
| 22 | 60 | 64 | 68 |
| 23 | 63 | 67 | 71 |
| 24 | 66 | 70 | 74 |
| 25 | 69 | 73 | 77 |
| 26 | 72 | 76 | 80 |
| 27 | 75 | 79 | 83 |
| 28 | 78 | 82 | 86 |
| 29 | 81 | 85 | 89 |
| 30 | 84 | 88 | 92 |
| 31 | 87 | 91 | 94 |
| 32 | 90 | 93 | 95 |

| MSB | CSB | LSB | Row |
|---|---|---|---|
| 8 | 3 | 0 | 1 |
| 11 | 5 | 1 | 2 |
| 14 | 7 | 2 | 3 |
| 17 | 10 | 4 | 4 |
| 20 | 13 | 6 | 5 |
| 23 | 16 | 9 | 6 |
| 26 | 19 | 12 | 7 |
| 29 | 22 | 15 | 8 |
| 32 | 25 | 18 | 9 |
| 35 | 28 | 21 | 10 |
| 38 | 31 | 24 | 11 |
| 41 | 34 | 27 | 12 |
| 44 | 37 | 30 | 13 |
| 47 | 40 | 33 | 14 |
| 50 | 43 | 36 | 15 |
| 53 | 46 | 39 | 16 |
| 56 | 49 | 42 | 17 |
| 59 | 52 | 45 | 18 |
| 62 | 55 | 48 | 19 |
| 65 | 58 | 51 | 20 |
| 68 | 61 | 54 | 21 |
| 71 | 64 | 57 | 22 |
| 74 | 67 | 60 | 23 |
| 77 | 70 | 63 | 24 |
| 80 | 73 | 66 | 25 |
| 83 | 76 | 69 | 26 |
| 86 | 79 | 72 | 27 |
| 89 | 82 | 75 | 28 |
| 91 | 85 | 78 | 29 |
| 93 | 88 | 81 | 30 |
| 94 | 90 | 84 | 31 |
| 95 | 92 | 87 | 32 |

| MSB | CSB | LSB | Row |
|---|---|---|---|
| 11 | 4 | 0 | 1 |
| 14 | 6 | 1 | 2 |
| 17 | 8 | 2 | 3 |
| 20 | 10 | 3 | 4 |
| 23 | 13 | 5 | 5 |
| 26 | 16 | 7 | 6 |
| 29 | 19 | 9 | 7 |
| 32 | 22 | 12 | 8 |
| 35 | 25 | 15 | 9 |
| 38 | 28 | 18 | 10 |
| 41 | 31 | 21 | 11 |
| 44 | 34 | 24 | 12 |
| 47 | 37 | 27 | 13 |
| 50 | 40 | 30 | 14 |
| 53 | 43 | 33 | 15 |
| 56 | 46 | 36 | 16 |
| 59 | 49 | 39 | 17 |
| 62 | 52 | 42 | 18 |
| 65 | 55 | 45 | 19 |
| 68 | 58 | 48 | 20 |
| 71 | 61 | 51 | 21 |
| 74 | 64 | 54 | 22 |
| 77 | 67 | 57 | 23 |
| 80 | 70 | 60 | 24 |
| 83 | 73 | 63 | 25 |
| 86 | 76 | 66 | 26 |
| 88 | 79 | 69 | 27 |
| 90 | 82 | 72 | 28 |
| 92 | 85 | 75 | 29 |
| 93 | 87 | 78 | 30 |
| 94 | 89 | 81 | 31 |
| 95 | 91 | 84 | 32 |

| MSB | CSB | LSB | Row |
|---|---|---|---|
| 64 | 32 | 0 | 1 |
| 65 | 33 | 1 | 2 |
| 66 | 34 | 2 | 3 |
| 67 | 35 | 3 | 4 |
| 68 | 36 | 4 | 5 |
| 69 | 37 | 5 | 6 |
| 70 | 38 | 6 | 7 |
| 71 | 39 | 7 | 8 |
| 72 | 40 | 8 | 9 |
| 73 | 41 | 9 | 10 |
| 74 | 42 | 10 | 11 |
| 75 | 43 | 11 | 12 |
| 76 | 44 | 12 | 13 |
| 77 | 45 | 13 | 14 |
| 78 | 46 | 14 | 15 |
| 79 | 47 | 15 | 16 |
| 80 | 48 | 16 | 17 |
| 81 | 49 | 17 | 18 |
| 82 | 50 | 18 | 19 |
| 83 | 51 | 19 | 20 |
| 84 | 52 | 20 | 21 |
| 85 | 53 | 21 | 22 |
| 86 | 54 | 22 | 23 |
| 87 | 55 | 23 | 24 |
| 88 | 56 | 24 | 25 |
| 89 | 57 | 25 | 26 |
| 90 | 58 | 26 | 27 |
| 91 | 59 | 27 | 28 |
| 92 | 60 | 28 | 29 |
| 93 | 61 | 29 | 30 |
| 94 | 62 | 30 | 31 |
| 95 | 63 | 31 | 32 |

| Die 1 | | | | Die 0 | | | |
|---|---|---|---|---|---|---|---|
| MSB | CSB | LSB | Row | MSB | CSB | LSB | Row |
| 64 | 32 | 16 | 1 | 64 | 63 | 0 | 1 |
| 65 | 33 | 17 | 2 | 65 | 62 | 1 | 2 |
| 66 | 34 | 18 | 3 | 66 | 61 | 2 | 3 |
| 67 | 35 | 19 | 4 | 67 | 60 | 3 | 4 |
| 68 | 36 | 20 | 5 | 68 | 59 | 4 | 5 |
| 69 | 37 | 21 | 6 | 69 | 58 | 5 | 6 |
| 70 | 38 | 22 | 7 | 70 | 57 | 6 | 7 |
| 71 | 39 | 23 | 8 | 71 | 56 | 7 | 8 |
| 72 | 40 | 0 | 9 | 72 | 55 | 16 | 9 |
| 73 | 41 | 1 | 10 | 73 | 54 | 17 | 10 |
| 74 | 42 | 2 | 11 | 74 | 53 | 18 | 11 |
| 75 | 43 | 3 | 12 | 75 | 52 | 19 | 12 |
| 76 | 44 | 4 | 13 | 76 | 51 | 20 | 13 |
| 77 | 45 | 5 | 14 | 77 | 50 | 21 | 14 |
| 78 | 46 | 6 | 15 | 78 | 49 | 22 | 15 |
| 79 | 47 | 7 | 16 | 79 | 48 | 23 | 16 |
| 80 | 48 | 8 | 17 | 80 | 47 | 24 | 17 |
| 81 | 49 | 9 | 18 | 81 | 46 | 25 | 18 |
| 82 | 50 | 10 | 19 | 82 | 45 | 26 | 19 |
| 83 | 51 | 11 | 20 | 83 | 44 | 27 | 20 |
| 84 | 52 | 12 | 21 | 84 | 43 | 28 | 21 |
| 85 | 53 | 13 | 22 | 85 | 42 | 29 | 22 |
| 86 | 54 | 14 | 23 | 86 | 41 | 30 | 23 |
| 87 | 55 | 15 | 24 | 87 | 40 | 31 | 24 |
| 88 | 56 | 24 | 25 | 88 | 39 | 8 | 25 |
| 89 | 57 | 25 | 26 | 89 | 38 | 9 | 26 |
| 90 | 58 | 26 | 27 | 90 | 37 | 10 | 27 |
| 91 | 59 | 27 | 28 | 91 | 36 | 11 | 28 |
| 92 | 60 | 28 | 29 | 92 | 35 | 12 | 29 |
| 93 | 61 | 29 | 30 | 93 | 34 | 13 | 30 |
| 94 | 62 | 30 | 31 | 94 | 33 | 14 | 31 |
| 95 | 63 | 31 | 32 | 95 | 32 | 15 | 32 |

900
FIG. 9

SYSTEM, METHOD AND COMPUTER PROGRAM PRODUCT FOR PROGRAMMING AND FOR RECOVERING FROM A POWER FAILURE

CROSS-REFERENCE TO RELATED APPLICATIONS

This application claims priority to U.S. Provisional Patent Application Ser. No. 61/513,937, filed Aug. 1, 2011, the disclosure of which is incorporated by reference in its entirety.

BACKGROUND ART

NAND Flash devices store information as charge in a NAND Flash cell. Multi-Level (MLC) NAND flash devices store k bits per cell using $2^k$ levels of charge. The amount of charge depends on the sequence of k bits being stored. For a certain sequence of k bits, the charge being stored may be distributed within a small range. FIG. 1 shows an example of a program level distribution 10 of a three bits per cell (bpc) MLC device—that includes 8 possible charge distributions (eight lobes denoted 11-18). As long as the charge distribution lobes are sufficiently distinct, the cell may be reliably read by read thresholds T1-T7 21-27.

The charge injection process is called programming. The programming process is simultaneously performed on a group of cells referred to here as a row. Furthermore, not all k bits within a cell are programmed simultaneously. In fact, each bit is of the k-bit sequence is stored in the row of cells during a separate programming operation.

FIG. 1 illustrates the bit by bit programming process of a 3 bpc MLC device. Initially, the LSB bit associated with each cell in the row is programmed. This is done by injecting charge if the bit is 0 and doing nothing if the LSB bit is 1. By the end of this programming step, each cell in the row contains charge distributed within the range given by one of the two lobes shown in program level distribution 30.

Subsequently, during a separate programming operation, the second (CSB) bit is programmed. This is done by injecting additional charge into the cell, depending on the CSB bit value and the previously programmed LSB bit. If the corresponding LSB bit was 1 and the CSB bit was 1, no additional charge is injected. If the corresponding LSB bit was 1 and the CSB bit was 0, some additional charge may be injected such that the total charge in the cell is distributed within the range defined by the second lobe of program level distribution 40.

If, the corresponding LSB bit was 0 and the CSB bit was 0, a small amount of additional charge may be injected such that the total charge in the cell is distributed within the range defined by the third lobe of program level distribution 40.

If the corresponding LSB bit was 0 and the CSB bit was 1, a larger amount of additional charge may be injected such that the total charge in the cell is distributed within the range defined by the fourth lobe in the program level distribution 40.

By the end of this CSB programming stage, each cell in the row contains charge distributed within the range given by one of the four lobes program level distribution 40.

In a similar process, the third, most significant bit (MSB), is programmed during a third programming step. Following this last programming step, each cell in the row contains charge distributed within the range given by one of the eight lobes shown in program level distribution 50.

Each such programming step is associated with a page number. That is, a programming step may be a page programming step and the Flash memory device may be divided into erase blocks, each erase block contains a multiple of pages.

In addition, to reduce cell to cell coupling, the steps defined above will typically be separated by programming steps of other rows. For example, programming may begin with the LSB bits associated with row 0, then the LSB bits associated with row 1 and only then will the CSB bits of row 0 will be programmed.

Table 300 of FIG. 3 contains an example of a page programming ordering table for any given block according to an embodiment of the invention.

Each page is associated with a row, and an MSB, CSB or LSB bit.

In practice, each of the three programming steps described above is broken down into smaller steps. For example, the CSB page programming step will typically be broken down into three sub-steps where in the first sub-step (resulting in intermediate program level distribution 32), all cells associated with an LSB value of 1 and a CSB value of 0 are injected with charge corresponding to the second lobe of the middle graph of program level distribution 40.

In the second sub-step (resulting in intermediate program level distribution 34), all cells associated with an LSB value of 0 and a CSB value of 0 are injected with charge corresponding to the third lobe of program level distribution 40.

And in the third sub-step (resulting in program level distribution 40), all cells associated with an LSB value of 0 and a CSB value of 1 are injected with charge corresponding to the fourth lobe of program level distribution 34. This process is depicted in FIG. 4 which is more detailed than FIG. 2. FIG. 4 includes program level distribution 30, intermediate program level distributions 32 and 34 and program level distribution 40.

Similarly, FIG. 5 depicts an example of 7 MSB programming sub-steps A-G and includes corresponding program level distributions 40 and 110-170.

In practical embedded systems the programming may be interrupted due to a sudden power loss. From of FIGS. 4 and 5 it is apparent that if the programming operation is interrupted before it completes, the device may be left in such a state that previously stored data may not be reliably read out. For example, if the programming operation is interrupted during the MSB bit programming, just following programming sub-step C in FIG. 5 (program level distribution 130) the cells will be left in such a state such that two charge distribution lobes overlap. The first associated with LSB=1, CSB=0 and MSB=1 and the second lobe associated with LSB=0 and CSB=0.

Such a failure poses two problems associated with the interrupted row programming:
  a. The thresholds needed to read the page are not the ones used to read the page after programming the LSB, CSB or MSB page but rather a mixture of them.
  b. There is no threshold which distinctly distinguishes between LSB bits. Therefore, even with optimal thresholds, data stored in the LSB bits may not be reliably read out (i.e. it will contain errors far beyond the error correction capability of the ECC).

The LSB bits in the above example may have been programmed a long time before the MSB bits but nevertheless, may be unreadable after interrupting the MSB bit programming. This type of failure is not acceptable in many applications and therefore, some measures are taken to handle loss of past information.

SUMMARY OF THE INVENTION

According to an embodiment of the invention a method may be provided and may include programming multiple logical pages to a flash memory module according to a programming order; wherein each logical page has a page number that reflects the programming order of the page; wherein the multiple logical pages comprise multiple groups of logical pages; wherein the multiple logical pages comprise logical pages of different types that differ from each other by significance; calculating a XOR value for each group of logical pages; storing the XOR value of each group of logical pages at the flash memory module; and using a XOR value of a group of logical pages to reconstruct a corrupted logical page of the group of logical pages; wherein up to a single logical page of each group of logical pages is programmed to a each row of a flash memory die of the flash memory module; and wherein logical page numbers of logical pages of a same type that belong to different groups of logical pages belong to non-overlapping numerical ranges.

The method may include detecting that a programming of a certain logical page failed or receiving an indication that the programming of the certain logical page failed; and finding at least one affected logical page that belongs to a same row as the certain logical page and that was programmed before the programming of the certain logical page failed; wherein the corrupted logical page is either one of the certain logical page or one of the at least one affected logical page.

Each group of logical pages may include logical pages from each type of the different types of logical pages.

Each group of logical pages may include only logical pages from a sub-set of types of the different types of logical pages.

Each group of logical pages may include logical pages that have logical page numbers that form a consecutive sequence of logical page numbers.

Each group of logical pages may include logical pages that have logical page numbers that form a non-consecutive sequence of logical page numbers.

The multiple logical pages may belong to different dies of the flash memory module that share same row numbers; wherein up to a single logical page of each group of logical pages may be programmed to a page associated with a single row number.

Different sets of logical pages that are associated to a same row number at different dice of the flash memory module may share up to a single page number of a same value.

The method may include programming multiple logical pages to multiple subsets of erase blocks of multiple flash memory dies of the flash memory module according to a programming order; wherein each subset of erase blocks may share same row numbers and different subsets of erase blocks differ from each other by row numbers; wherein the programming may include performing, in a serial manner, multiple programming sequences; wherein each programming sequence may involve up to a single erase block out of each subset of erase blocks.

The method may include maintaining a same programming order per erase block.

The method may include receiving multiple information entities to be programmed to logical pages of different erase blocks of the flash memory module in an interleaved manner; wherein each group of logical pages may include logical pages to be programmed in a continuous manner.

Further embodiments of the invention include a computer readable medium that is non-transitory and may store instructions for performing the above-described methods and any steps thereof, including any combinations of same. For example, the computer readable medium may store instructions for programming multiple logical pages to a flash memory module according to a programming order; wherein each logical page has a page number that reflects the programming order of the page; wherein the multiple logical pages comprise multiple groups of logical pages; wherein the multiple logical pages comprise logical pages of different types that differ from each other by significance; calculating a XOR value for each group of logical pages; storing the XOR value of each group of logical pages at the flash memory module; and using a XOR value of a group of logical pages to reconstruct a corrupted logical page of the group of logical pages; wherein up to a single logical page of each group of logical pages is programmed to a each row of a flash memory die of the flash memory module; and wherein logical page numbers of logical pages of a same type that belong to different groups of logical pages belong to non-overlapping numerical ranges.

The non-transitory computer readable medium according may be arranged to store instructions for: detecting that a programming of a certain logical page failed or receiving an indication that the programming of the certain logical page failed; and finding at least one affected logical page that belongs to a same row as the certain logical page and that was programmed before the programming of the certain logical page failed; wherein the corrupted logical page is either one of the certain logical page or one of the at least one affected logical page.

Each group of logical pages may include logical pages from each type of the different types of logical pages.

Each group of logical pages may include only logical pages from a sub-set of types of the different types of logical pages.

Each group of logical pages may include logical pages that have logical page numbers that form a consecutive sequence of logical page numbers.

Each group of logical pages may include logical pages that have logical page numbers that form a non-consecutive sequence of logical page numbers.

The multiple logical pages may belong to different dies of the flash memory module that share same row numbers; wherein up to a single logical page of each group of logical pages may be programmed to a page associated with a single row number.

Different sets of logical pages that are associated to a same row number at different dice of the flash memory module may share up to a single page number of a same value.

The non-transitory computer readable medium according may be arranged to store instructions for programming multiple logical pages to multiple subsets of erase blocks of multiple flash memory dies of the flash memory module according to a programming order; wherein each subset of erase blocks share same row numbers and different subsets of erase blocks differ from each other by row numbers; wherein the programming may include performing, in a serial manner, multiple programming sequences; wherein each programming sequence involves up to a single erase block out of each subset of erase blocks.

The non-transitory computer readable medium according may be arranged to store instructions for maintaining a same programming order per erase block.

The non-transitory computer readable medium according may be arranged to store instructions for receiving multiple information entities to be programmed to logical pages of different erase blocks of the flash memory module in an interleaved manner; wherein each group of logical pages may include logical pages to be programmed in a continuous manner.

Additional embodiments of the invention include a system arranged to execute any or all of the methods described above, including any stages and any combinations of same. For example, the system may include (a) a flash memory controller that may include a programming circuit arranged to program multiple logical pages to a flash memory module according to a programming order;
wherein each logical page has a page number that reflects the programming order of the page; wherein the multiple logical pages comprise multiple groups of logical pages; wherein the multiple logical pages comprise logical pages of different types that differ from each other by significance; a XOR circuit arranged to calculate a XOR value for each group of logical pages; (b) wherein the programming module may be arranged to store the XOR value of each group of logical pages at the flash memory module; and (c) a reconstruction circuit may be arranged to use a XOR value of a group of logical pages to reconstruct a corrupted logical page of the group of logical pages; wherein up to a single logical page of each group of logical pages is programmed to a each row of a flash memory die of the flash memory module; and wherein logical page numbers of logical pages cola same type that belong to different groups of logical pages belong to non-overlapping numerical ranges.

The reconstruction circuit may be arranged to receive an indication that the programming of the certain logical page failed; and find at least one affected logical page that belongs to a same row as the certain logical page and that was programmed before the programming of the certain logical page failed; wherein the corrupted logical page is either one of the certain logical page or one of the at least one affected logical page.

The flash memory controller may include a rules circuit may be arranged to define each group of logical pages as comprising logical pages from each type of the different types of logical pages.

The rules circuit may be arranged to define each group of logical pages as comprising only logical pages from a sub-set of types of the different types of logical pages.

The rules circuit may be arranged to define each group of logical pages as comprising logical pages that have logical page numbers that form a consecutive sequence of logical page numbers.

The rules circuit may be arranged to define each group of logical pages as comprising logical pages that have logical page numbers that form a non-consecutive sequence of logical page numbers.

The multiple logical pages may belong to different dies of the flash memory module that share same row numbers; wherein the programming circuit may be arranged to program up to a single logical page of each group of logical pages to a page associated with a single row number.

The programming circuit may be arranged to program different sets of logical pages that are associated to a same row number at different dice of the flash memory module so that the different sets of logical pages share up to a single page number of a same value.

The programming circuit may be arranged to program multiple logical pages to multiple subsets of erase blocks of multiple flash memory dies of the flash memory module according to a programming order; wherein each subset of erase blocks share same row numbers and different subsets of erase blocks differ from each other by row numbers; wherein the programming circuit may be arranged to perform, in a serial manner, multiple programming sequences; wherein each programming sequence involves up to a single erase block out of each subset of erase blocks.

The programming circuit may be arranged to maintain a same programming order per erase block.

The programming circuit may be arranged to receive multiple information entities to be programmed to logical pages of different erase blocks of the flash memory module in an interleaved manner; wherein each group of logical pages may include logical pages to be programmed in a continuous manner.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 illustrates a programming order and multiple groups of pages according to an embodiment of the invention;

FIG. 6 illustrates a programming order and multiple groups of pages according to an embodiment of the invention;

FIG. 7 illustrates a programming order and multiple groups of pages according to an embodiment of the invention;

FIG. 8 illustrates a programming order and multiple groups of pages according to an embodiment of the invention;

FIG. 9 illustrates a programming order and multiple groups of pages according to an embodiment of the invention;

Figure 1:
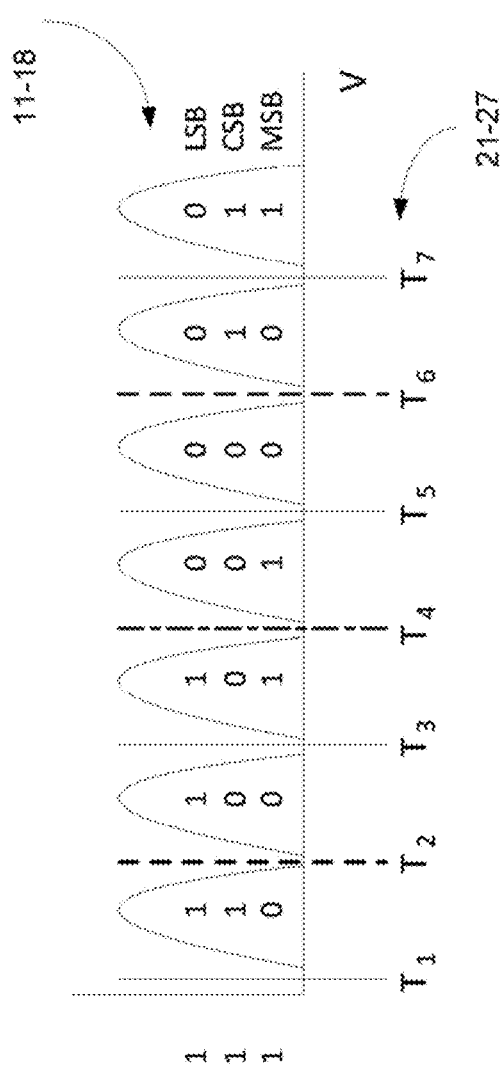
FIG. 1 illustrates a prior art program level distribution of a three bits per cell flash memory cell.
Figure 2:
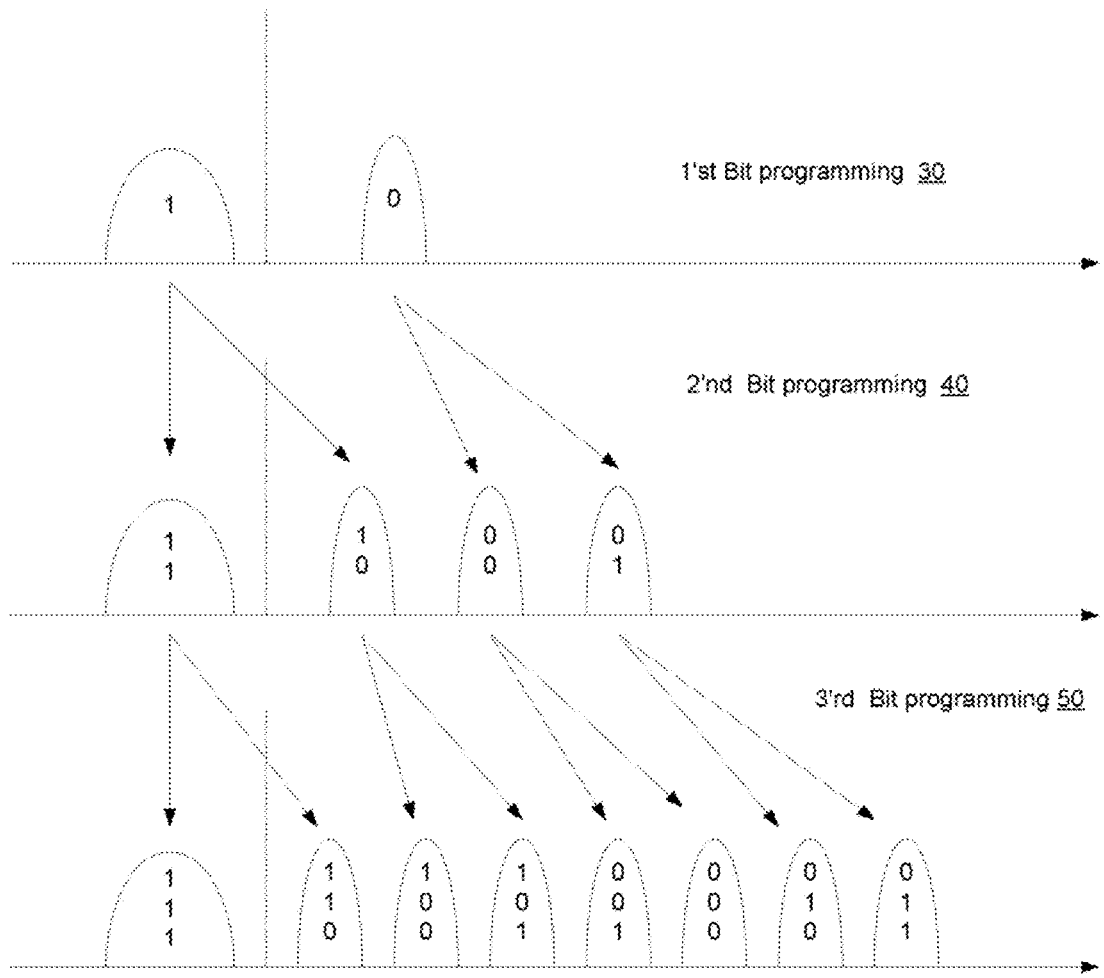
FIG. 2 illustrates a prior art programming process of a two bits per cell flash memory cell.
Figure 4:
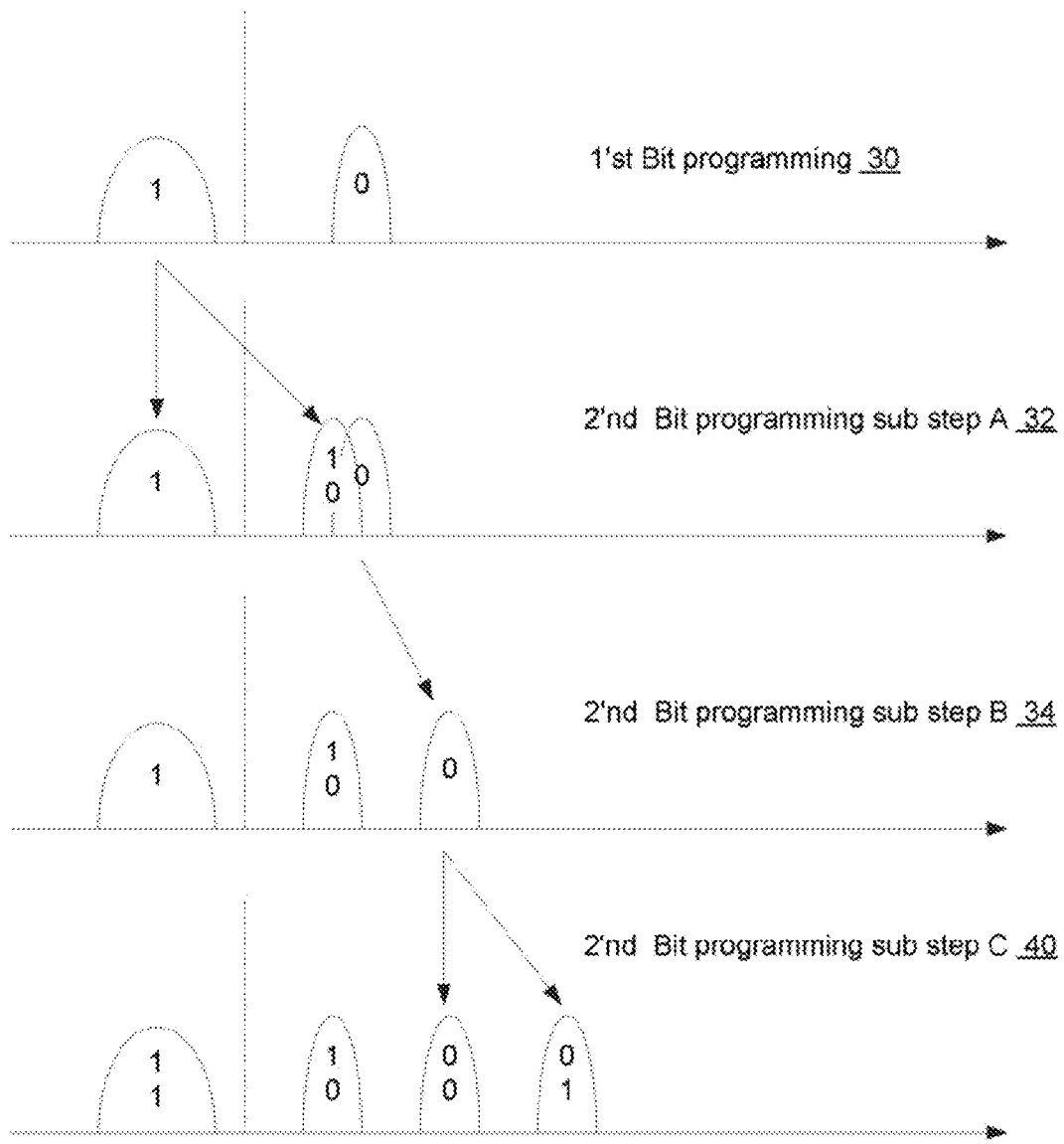
FIG. 4 illustrates a prior art programming process or a two bits per cell flash memory cell.
Figure 5:
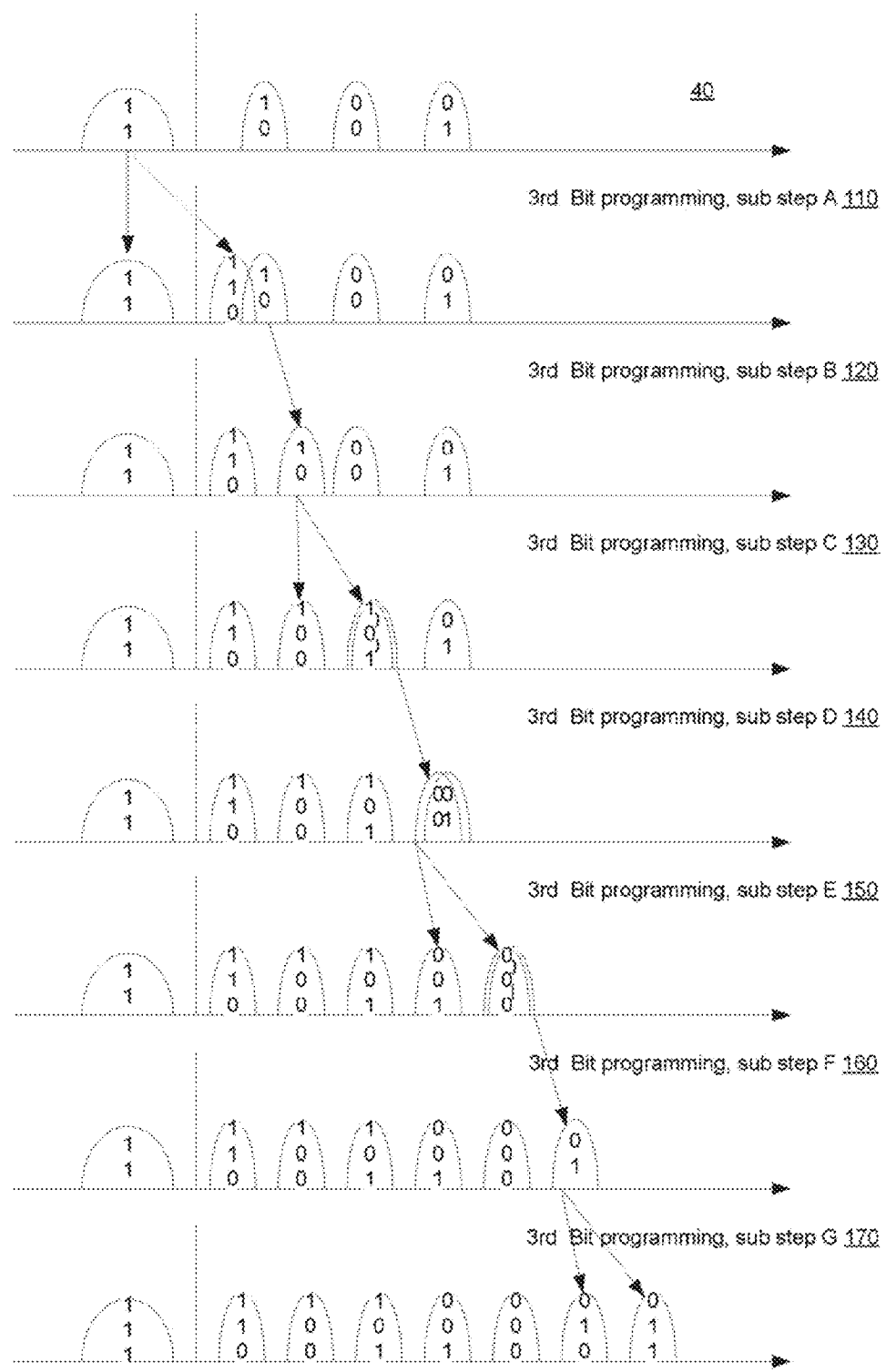
FIG. 5 illustrates a prior art programming process of a three bits per cell flash memory cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

According to an embodiment of the invention a basic approach to preventing previously programmed data loss is to perform a "backup" oldie previously programmed data. That is, allocate a dedicated "backup" NAND Flash block that will contain copies of previously programmed pages (recollect that NAND Flash devices have multiple blocks which are erased as a unit, each block contains multiple pages, and each page is programmed as a unit and contains multiple bits).

Before programming any CSB or MSB pages into a row, the previously programmed pages are copied into the "backup" block, if this was not already done in the past. Thus, previously written data that was corrupted by programming interruption can be recovered from the "backup" block.

Note that corruption of the backup block is not an issue as it may be always erased and reused for new backups. Further note that the page backup operation may be done following a programming operation, anticipating programming operations in the future.

However, the above solution uses additional write operations and therefore suffers from reduced performance. Especially if many short write transactions are performed in a block and before or after each write transaction a backup operation must occur. In the worst case, we would need to rewrite 2 thirds of the data into the "backup" block.

According to another embodiment of the invention—instead of "backing-up" each page which may be corrupted by an interrupted programming operation, a backup is provided for a result of applying an exclusive OR (XOR) operation of several such pages. Thus, decrease the "backup" frequency.

There is provided a method that XORs together only pages where at any point, no more than one of these XORed pages will be corrupted by an interrupted programming operation.

For example, consider the table 300 in FIG. 3. During the programming of pages 0 through 13, we store in backup, the following XOR results (of four XOR groups of pages):
  i. The XOR of page 0 and 1.
  ii. The XOR of page 2, 3 and 4.
  iii. The XOR of pages 6, 7 and 9.
  iv. The XOR of 10, 12 and 13.

Thus, if page 8 programming fails, we may corrupt either page 4 and\or 1. As the rest of the previously programmed pages are still recoverable, we may use the backed up XORed information to recover both page 1 and 4.

To recover page 1 we read page 0 and XOR it with the backed up XOR of page 0 and 1. To recover page 4 we read page 3 and XOR it with the read result of page 2 and with the backed up XOR of page 2, 3 and 4.

It is noted that using the basic approach mentioned above, we would have needed to backup each of the pages 0, 1, 2, 3, 4, 6, 7, 9, 10, 12 and 13 separately (11 pages).

Instead, when storing the XOR results, there is a need to store one page (XOR result) per one XOR group of pages—in the above case this results in storing only four pages into the backup block.

This gives a ratio of 4/11 in favor of the XOR related method. Had we continued this to the end of the block, the ratio would have become nearly 1/3.

The gain was due to the fact that an interrupted programming operation may only corrupt the underlying LSB and CSB pages on the same row. Furthermore, note that to perform the XORing operation we must temporarily store intermediate information in a buffer, say RAM buffer.

According to various embodiments of the invention the method can take into account different page orderings and detail their effect on the backup ratio compared to the basic approach mentioned above.

According to various embodiments of the invention the method can be applied in cases where programming is performed into several blocks intermittently.

According to various embodiments of the invention the method can take into account buffer sizes and can reduce the buffer size.

The XOR method above may be applied to different page ordering methods as well. For example, consider table 600 of FIG. 6 Here the page ordering is of a different type than the one of table 300 of FIG. 3.

In table 300 the ordering is of type 1 as the LSB pages programming order precede by one row (at least) the CSB pages. Similarly the CSB pages programming order precede by one row (at least) the MSB pages.

In table 600 of FIG. 6 the programming order is of type two as the LSB and CSB programming order precede by (at least) two rows the CSB and MSB pages respectively.

We now apply the XOR method to the page programming order of table 600. For programming pages 0 through 37 we store in backup the following 6 XOR groups of pages:
  i. the XOR of pages 0, 1 and 2;
  ii. The XOR of pages 3, 4, 5, 6 and 7;
  iii. The XOR of pages 9, 10, 12, 13 and 15;
  iv. the XOR of pages 16, 18, 19, 21 and 22;
  v. The XOR of pages 24, 25, 27, 28 and 30; and
  vi. the XOR of pages 31, 33, 34, 36 and 37

We can use the above backup operation to restore pages corrupted by an interruption of an MSB page programming. For example, if the programming of page 23 had been interrupted, page 9 and/or 16 may have been corrupted. Therefore, to restore page 9 we need to XOR the content pages 10, 12, 13, 15 and the backed up XOR combination iii. To restore page 16, we need to XOR the content of pages 18, 19, 21, 22 and the backed up XOR combination iv.

Note that had we used the basic approach, we would have needed to store 26 pages in the backup block. Instead, we were able to store only 6 pages. This gives a ratio of 6/26 in favor of the XOR method. Over an entire block this ratio is closer to 1/5.

The ratio may be decreased by choosing other programming order types. For example, table 700 of FIG. 7 illustrates a type 3 example with a ratio close to 1/7. In general, the ratio is approximately 1/(2*type_number+1) in favor of the XOR method.

FIG. 8 includes table 800 that shows a programming order where the LSB pages are programmed first, the CSB pages are programmed next and then the MSB pages. For such an order we can backup only the XOR of the LSB pages and the XOR of the CSB pages. This would give us a ratio of 1/32 in favor of the XOR method.

Other page ordering may include interleaving between even and odd pages. That is, there may be even and odd MSB, CSB and LSB pages which are programmed sequentially. We can allow XORing between even and odd pages as these are not programmed together. This gives a ratio of 1/2/(2*type_number+1) in favor of the XOR method.

We can also accommodate other programming orders as described in U.S. patent Ser. No. 13/299,276 filing date Nov. 17, 2011.

According to an embodiment of the invention a general rule for defining the XOR groups would be that each group contains a sequential list of page numbers (here we include the MSB pages) such that in each group there is no overlap in the rows of the MSB pages, rows of the CSB pages and the rows of the LSB pages. Note that here we included in the XOR group also the MSB pages even though in the above examples these were not XORed. It is also possible to XOR the LSB pages in the above example. This may be important if we wish to recover from programming failures caused by the NAND Flash device as will be described later on. However, during page recovery, this requires reading additional pages.

The XOR groups defined above may be split into subgroups which may be stored into the backup block. The value of such splitting is that it may reduce the recovery time by reducing the number of pages which need to be read during the page recover.

RAM Buffer Size Reduction

The schemes defined above may require a RAM buffer to hold the intermediate XOR operation results. The size of the RAM buffer depends on the size of a NAND Flash page and the number of NAND Flash devices which are simultaneously programmed.

Programming several NAND flash devices is usually required to increase the programming rate. When a sudden power loss occurs during programming it may corrupt the underlying pages in rows in all devices that are simultaneously being programmed. Therefore, one way to apply the above methods is to multiply the RAM buffer, according to the number of pages being simultaneously programmed.

However, in some cases there may not be sufficient RAM resources to hold this buffer. Therefore, there is provided a page programming ordering scheme and a XORing scheme that allows reducing the required RAM buffer.

FIG. 9 includes table 900 that illustrates an exemplary programming order for a dual die case. In the table 900 the LSB pages are not programmed in the same order as the rows. On die 0, pages 0 through 7 are programmed to rows 1 through 8, pages 8 through 15 are programmed to rows 25 through 32 and pages 16 through 31 are programmed to rows 9 through 24. On die 1 the programming is reversed. That is, pages 0 through 15 are programmed to rows 9 through 24, pages 16 through 23 are programmed to rows 1 through 8 and pages 24 through 31 are programmed to the corresponding rows.

In such an ordering the some of the LSB pages may suffer from coupling due to pages programmed before and after. This may degrade the reliability but as this is done during the LSB page programming, the impact on reliability is the smallest.

The CSB pages are programmed sequentially, after completing the programming of all LSB pages. However, for die 0 the CSB pages are first programmed to row 32 and continue downward to row 1. For die 1, the programming order of the CSB pages is in the regular order starting from row 1 up to row 32. For the MSB pages the ordering is the regular programming order from row 1 to 32.

We now can define 4 XOR groups as follows:
i. Pages 0-15 on die 0 (rows 1-8 and 25-32) and die 1 (rows 9-24).
ii. Pages 16-31 on die 0 (rows 9-24) and die 1 (rows 1-8 and 25-32).
iii. Pages 32-47 on die 0 (rows 32-17) and die 1 (rows 1-16).
iv. Pages 48-63 on die 0 (rows 16-1) and die 1 (rows 17-32).

Note that even though we program here both dies simultaneously, we only have a page size RAM buffer to hold the intermediate XOR results (of both dies)—as logical pages that belong to different dies and are programmed simultaneously or adjacent to each other may belong to the same XOR group of pages.

The above XOR groups are stored in a backup block and will enable recovering corrupted pages during a power-loss. For example, assume that there has been a power loss during the programming of page 56 on die 0 and die 1. Such a power loss may corrupt the underlying pages on both dies. That is, it may corrupt, page 7 on die 0 and page 24 on die 1.

However, page 7 of die 0 appears only in XOR group i and page 24 of die 1 appears only in XOR group ii. Since only one page was corrupted in each XOR group, the data may be fully recovered by reading the appropriate pages from the blocks on both dies and XORing with the appropriate XOR group.

Alternatively, if the programming of page 82 was interrupted, pages 26 and 45 on die 0 (belonging to XOR groups ii and iii) and pages 10 and 50 on die 1 (belonging to XOR groups i and iv) may be corrupted. Again, as one page was corrupted in each XOR group, the data may be fully recovered.

There are many page orderings that will allow using just one page buffer for two or more dies. The rule for a possible page ordering is that for each page number, the page numbers of underlying pages on all dies would be different. The XOR groups can then be defined using the rule given above for a chosen programming order.

Figure 10:
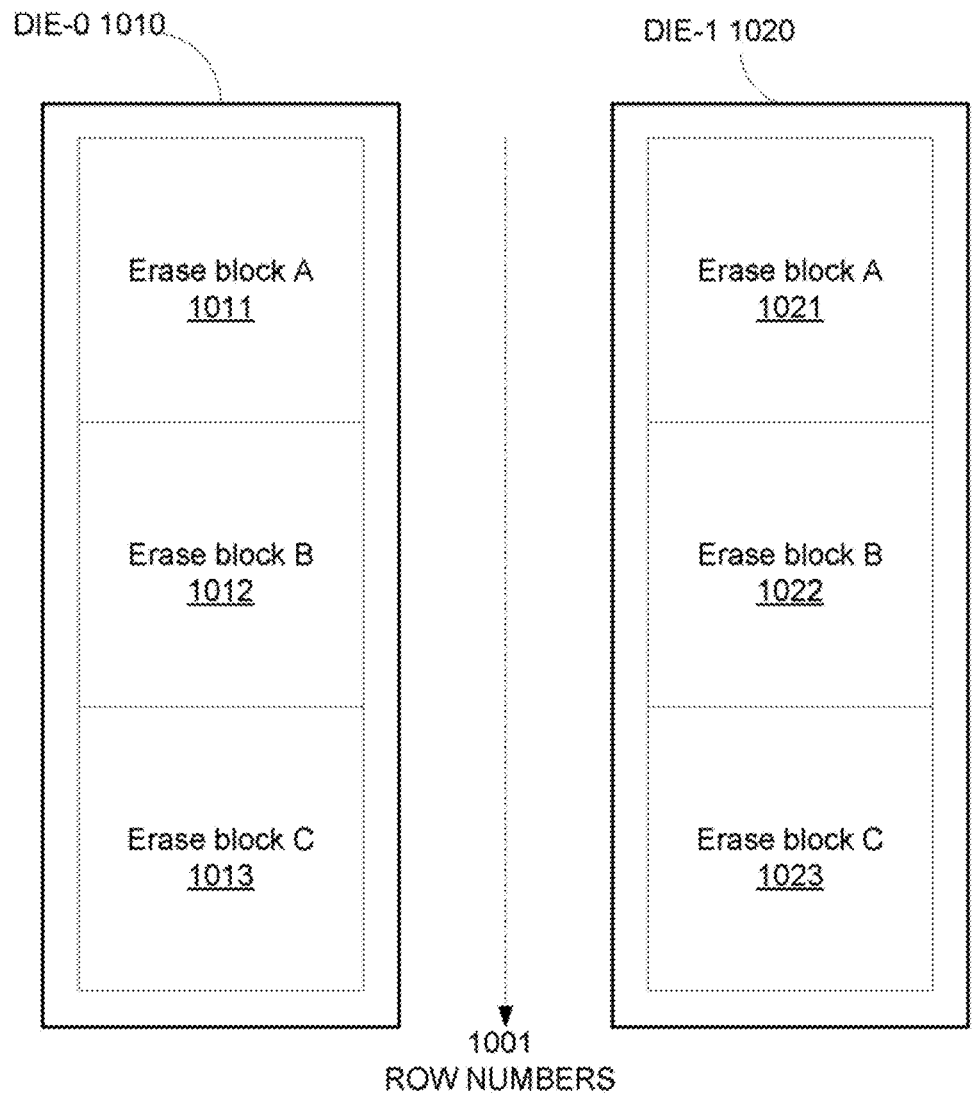
FIG. 10 illustrates an interleaved programming scheme of multiple pages of multiple erase blocks of multiple flash memory dies according to an embodiment of the invention.

Another method of limiting the RAM buffer size requirements and yet allowing any page ordering or page XORing groups is depicted in FIG. 10. FIG. 10 illustrates flash memory dice 1010 and 1020, each includes three erase blocks—erase blocks A-C 1011-1013 of first flash memory die 1010 and erase blocks A-C 1021-1023 of second flash memory die 1020.

It is assumed that erase blocks A 1011 and 1021 form a first subset of erase blocks and that erase blocks A 1011 and 1021 are associated with the same row numbers, erase blocks B 1012 and 1022 form a second subset of erase blocks and that erase blocks B 1012 and 1022 are associated with the same row numbers, that erase blocks C 1013 and 1023 form a third subset of erase blocks and that erase blocks C 1013 and 1023 are associated with the same row numbers, and that different subsets of erase blocks are associated with different row numbers.

Previously, we considered the case where each block is programmed sequentially, according to a predefined page ordering. We will now consider the possibility of programming 3 blocks per die.

Each block is programmed according to some page ordering specifications. However, we program these block intermittently. That is, we program the first XOR group to block A on die 1 and 2, then the first XOR group to block B on die 1 and 2 and last the first XOR group of block C on die 1 and 2.

Note that we only use a single buffer in RAM, the size of a single die page. That is, the pages programmed to die 1 and die 2 are XORed with one another. However, the block programming order makes sure that a power failure will, at most, only corrupt a single page in any of the 2 XOR groups being simultaneously programmed on die 1 and die 2.

We make sure of that by modifying the block programming ordering for the second and third groups. The second XOR group is programmed in the following order:

a. block A on die 1 and block B on die 2;
b. block B on die 1 and block C on die 2; and
c. block C on die 1 and block A on die 2.

Thus, if a power failure occurs during programming of pages belonging to this XOR group, we will never corrupt simultaneously blocks A on die 1 and on die 2. Thus, this XOR group will be recoverable. Similarly holds true for the other blocks.

When we program the third XOR group we will use the following block program ordering:

a. block A on die 1 and block C on die 2.
b. block B on die 1 and block A on die 2, and
c. block C on die 1 and block B on die 2.

Again, any power failure during the programming of stages, a, b or c will always be recoverable due to the XOR storage in the previous steps.

This technique may also be used to limit the buffer size to a single buffer when considering even more dies that are programmed simultaneously by increasing the number of blocks that a programmed intermittently per die.

Handling programming failures initiated by Flash device.

Flash devices may fail to program. A status generated by the flash device reports this failure. Typically, a programming failure does not corrupt the underlying pages. However, it may not be possible to recover the failed page from the flash device. One solution is to keep a shadow of the programmed page in a ram buffer on the controller until a confirmation of successful programming is received from the flash device. However, if several NAND devices are programmed simultaneously, this would require a RAM shadow for each NAND device.

One way to minimize the overhead of having a RAM shadow for each device is to use the RAM buffer used to store intermediate XOR results. That is, XOR also pages that were previously not XORed (e.g. MSB pages). A failed page may be recovered since the underlying pages are not corrupted. It may be that one page buffer may be used to store the XOR of several NAND flash devices that are programmed simultaneously. In that case, if more than one NAND flash device fails to program, we may not be able to recover all failed pages. However, this is extremely unlikely.

Thus, we can use the method above to recover both corrupted pages due to interrupted programming and failed pages due to NAND device failed programming procedure.

Multiple Blocks Access

Until now we discussed the case where a sequence of write transactions are programmed sequentially into a single block per plane/die. However, it may be that transactions are interlaced between several blocks. For example, transaction 1 going to the first block in the die, the second to a second block in the same die and the third going to the first block again. In that case, we may need to back-up the XORed data before writing to a new block as the XOR group is given per block.

However, since the programming operations to different blocks are done at different times, we may aggregate the blocks and XOR them together instead of backing up the XOR buffer when we switch between blocks. However, then we will have many possible XOR groups. In order to identify the XOR groups we may attach meta-data to the backed up page. Thus, when a page is corrupted due to a power loss we may be able to learn the XOR group associated with that page from the meta-data.

Figure 11:
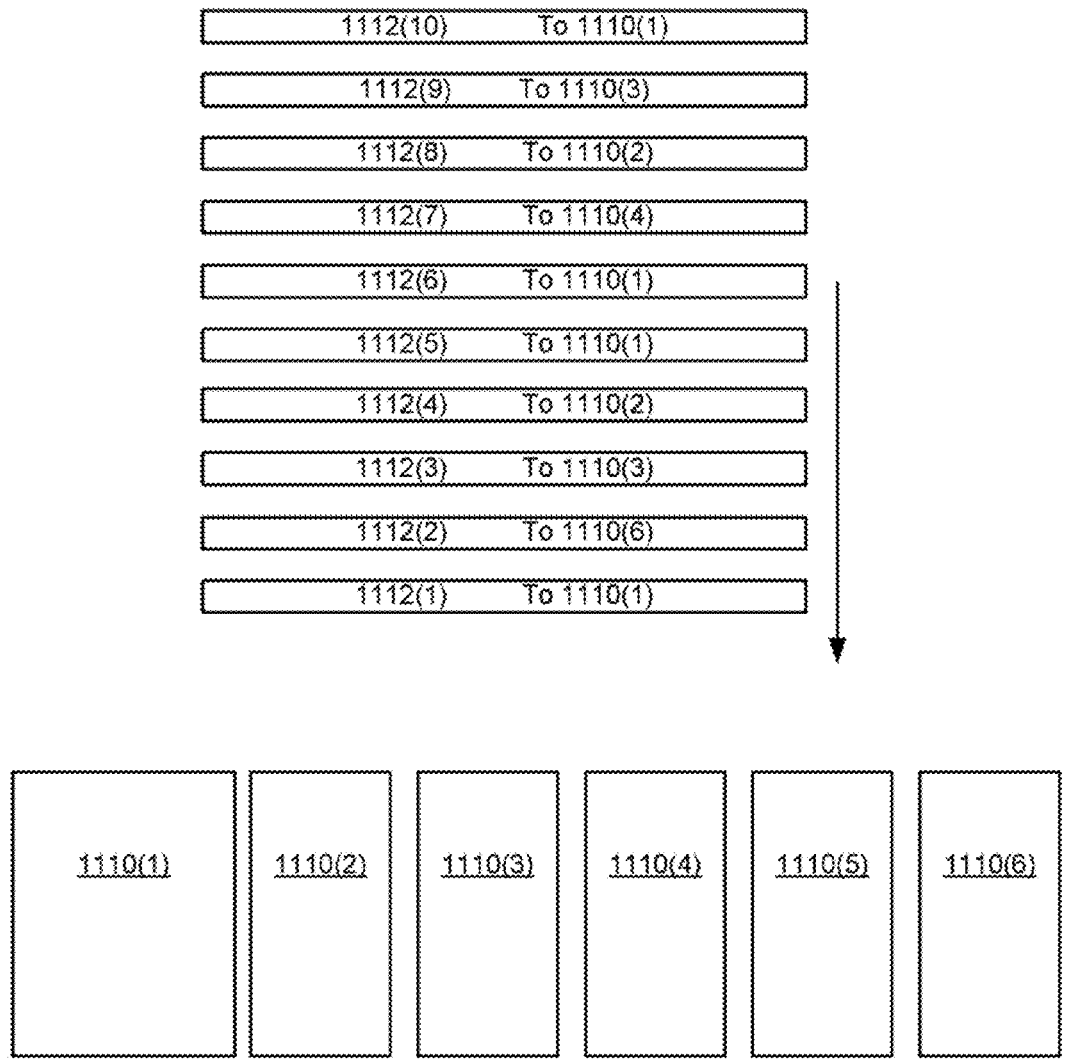
FIG. 11 illustrates a programming and XOR group formation process according to an embodiment of the invention.

FIG. 11 illustrates a programming and XOR group formation process according to an embodiment of the invention.

A sequence of pages 1112(1)-1112(10) should be programmed (LSB, CSB or MSB programming) to blocks 1110(1)-1110(6) in an interlaced manner:

| Type of programming | Target block | Page | Row number |
|---|---|---|---|
| LSB | 1110(1) | 1112(1) | 1 |
| MSB | 1110(6) | 1112(2) | 10 |
| LSB | 1110(3) | 1112(3) | 8 |
| CSB | 1110(2) | 1112(4) | 22 |
| LSB | 1110(1) | 1112(5) | 2 |
| CSB | 1110(1) | 1112(6) | 1 |
| LSB | 1110(4) | 1112(7) | 18 |
| MSB | 1110(2) | 1112(8) | 21 |
| CSB | 1110(3) | 1112(9) | 7 |
| LSB | 1110(1) | 1112(10) | 2 |

In this example a first XOR group can be defined and may include pages 1112(1)-1112(5) as these pages are aimed to different rows. A second XOR group should start at 1112(6) as page 1112(1) of the first XOR group and page 1112(6) are targeted to the same row and should not be included at the same XOR group. The second XOR group may include pages 1112(5)-1112(10).

As only one XOR group is opened at a time the intermediate XOR results and the final XOR results can be stored in a single page of the RAM.

When Storing a XOR group buffer in (backup) SLC, the XOR group should be stored with metadata containing all pages included in that XOR group (indicating for each page, a block number, and page number within the block).

Figure 12:
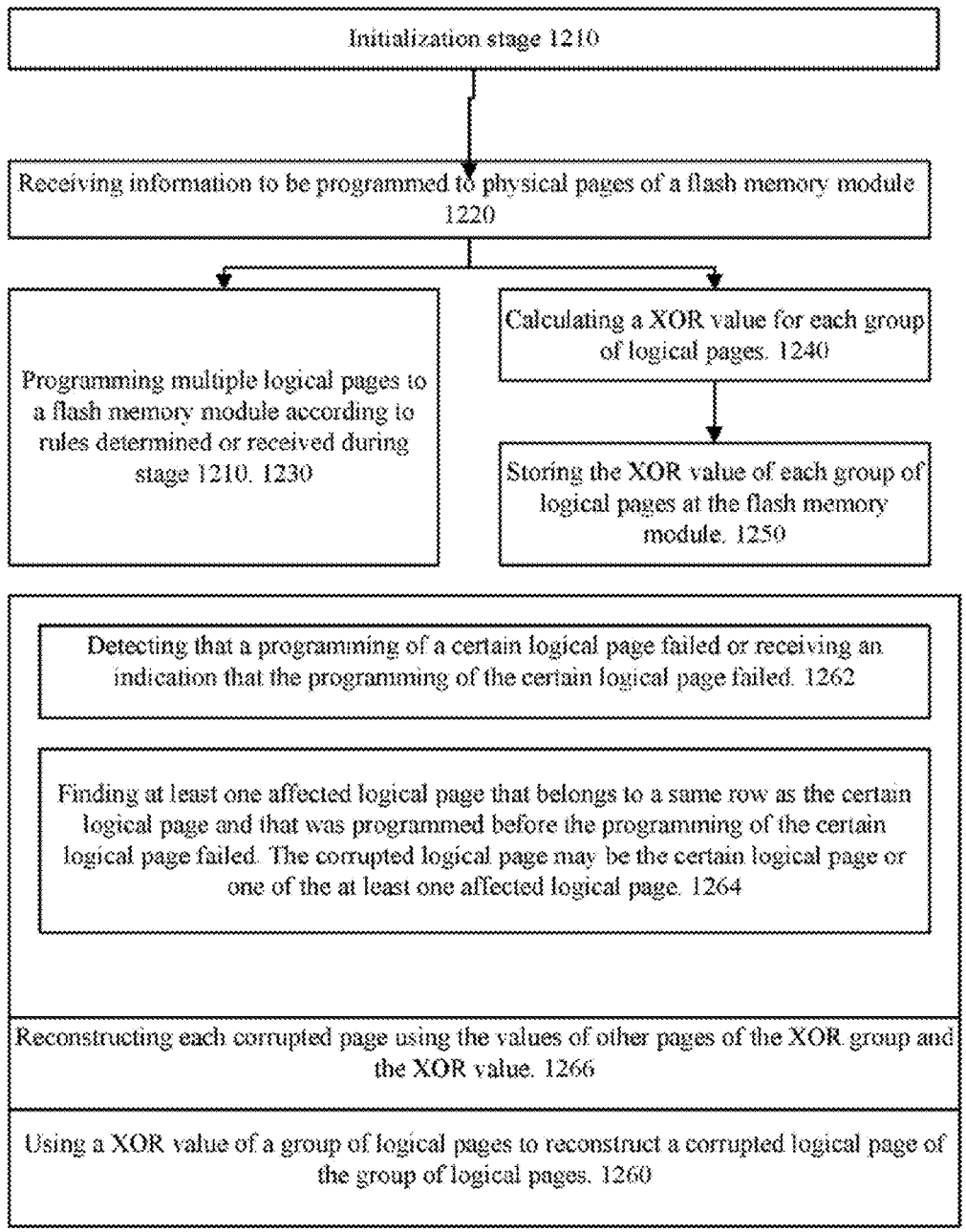
FIG. 12 illustrates a method according to an embodiment of the invention.

FIG. 12 illustrates method 1200 according to an embodiment of the invention.

Method 1200 may start by an initialization stage 1210 that may include receiving and, additionally or alternatively, determining rules. This may include (a) receiving a programming rule that defines a programming order or determining the programming rule, and (b) receiving a grouping rule for grouping logical pages or determining the grouping rule.

The rules may be applied on multiple logical pages to be programmed. Each logical page has a page number that reflects the programming order of the page. The multiple logical pages should be grouped (according to a grouping rule) to multiple groups of logical pages (also referred to as XOR groups). The multiple logical pages include logical pages of different types that differ from each other by significance—such as MSB, at least zero CSB and LSB.

According to an embodiment of the invention stage 1210 may include receiving and/or defining the following rules:

a. Up to a single logical page of each group of logical pages is programmed to each row of a flash memory die of the flash memory module. For example, the same group of logical pages should not include two different types of logical pages that belong to the same row of the same flash memory die.

b. Logical page numbers of logical pages of a same type that belong to different groups of logical pages belong to non-overlapping numerical ranges. For example—if page numbers 4 and 8, belong to a first group of logical pages then page number 7 does not belong to another group of logical pages. This is illustrated, for example, by tables 300, 600 and 700.

According to an embodiment of the invention stage 1210 may include receiving and/or defining the following rules:

a. Each group of logical pages may include only logical pages from a sub-set of types of the different types of logical pages. For example, a group of logical pages may include CSB and LSB pages but not include MSB pages.

b. Each group of logical pages comprises logical pages that have logical page numbers that form a consecutive sequence of logical page numbers. This can be the case if for example, each group of logical pages includes pages of all types—LSB, at least zero CSB (if such exist) and MSB. In three bpc devices each group of logical pages may include CSB logical pages, LSB logical pages and MSB logical pages.

c. Each group of logical pages comprises logical pages that have logical page numbers that form a non-consecutive sequence of logical page numbers. This can be the case if, for example, only some types of programming are included in each group.

d. In the case of a flash memory module that includes different dies that may share the same row numbers—up to a single logical page of each group of logical pages may be programmed to a page associated with a single row number. Thus, a group of logical pages includes one (or less) logical pages per row number (regardless of the flash memory die it belongs to).

e. In the case of a flash memory module that includes multiple dice that may share the same row number—the programming order is set such that different sets of logical pages (each set of logical pages includes logical pages of different types that belong to the same row of the same flash memory die) share up to a single page number of a same value. An example is illustrated in table 900 of FIG. 9. Referring to the first row—a first set of logical pages includes the LSB, CSB and MSB pages of the first row of die 0 having numbers 0, 63 and 64, a second set of logical pages includes the LSB, CSB and MSB pages of the first row of die 1 having numbers 16, 32 and 64—whereas only page number 64 appear in both sets.

f. In case of programming multiple logical pages to multiple subsets of erase blocks of multiple flash memory dies of the flash memory module, wherein each subset of erase blocks share same row numbers and different subsets of erase blocks differ from each other by row numbers, the programming order may dictate performing, in a serial manner, multiple programming sequences; wherein each programming sequence involves up to a single erase block out of each subset of erase blocks. The programming order may be maintained per erase block. FIG. 10 illustrates such as example.

g. In case of receiving multiple information entities to be programmed to logical pages of different erase blocks of the flash memory module in an interleaved manner, each group of logical pages may be defined to include logical pages to be programmed in a continuous manner—as long as each group of logical pages doe not include more that one logical page per row. This is illustrated in FIG. 11.

Stage 1210 may be followed by multiple repetitions of stages 1220-1250 and may be followed by multiple repetitions of stage 1260.

Stage 1220 may include receiving information to be programmed to physical pages of a flash memory module. Each physical page of the flash memory module can store multiple logical pages. Hence it may be inferred that the information should be programmed to logical pages. The information may be received at a random access memory (RAM) that may be accessed by a flash memory controller.

Stage 1220 may be followed by stages 1230 and 1240.

Stage 1230 may include programming multiple logical pages to a flash memory module according to rules determined or received during stage 1210.

For example, the programming can be performed according to a programming order. Each logical page has a page number that reflects the programming order of the page. The multiple logical pages may include multiple groups of logical pages (also referred to as XOR groups). The multiple logical pages include logical pages of different types that differ from each other by significance—such as MSB, at least zero CSB and LSB. Up to a single logical page of each group of logical pages is programmed to each row of a flash memory die of the flash memory module. Logical page numbers of logical pages of a same type that belong to different groups of logical pages belong to non-overlapping numerical ranges.

Stage 1240 includes calculating a XOR value for each group of logical pages. The calculation may include:

a. Storing as a first intermediate XOR value the first logical page of a XOR group.

b. Before programming (or while programming) each of the next logical pages of the XOR group—sending the last logical page and the last intermediate XOR result (stored in the RAM) to a XOR circuit and calculating a current intermediate XOR result to be stored in the RAM.

c. Providing a XOR result of the XOR group by calculating a XOR result of the last page of the XOR group with the XOR result that represents the XOR of all pages of the XOR group except the last page.

Stage 1240 is followed by stage 1250 of storing the XOR value of each group of logical pages at the flash memory module.

It is noted that although stages 1230 and 1240 are illustrated as different stages they may be executed in an interleaved manner—information of a logical page is programmed, its content is used for calculating a XOR value, another logical page is received, and its content is used for updating the XOR value and so on.

Stages 1220-1250 can be repeated for each XOR group.

Method 1200 may also include a recovery of a corrupted logical page.

The recovery process is illustrates by stage 1260 of using a XOR value of a group of logical pages to reconstruct a corrupted logical page of the group of logical pages.

Stage 1260 may include stages 1262, 1264 and 1266. Stage 1262 may include detecting that a programming of a certain logical page failed or receiving an indication that the programming of the certain logical page failed. Stage 1264 may include finding at least one affected logical page that belongs to a same row as the certain logical page and that was programmed before the programming of the certain logical page failed. The corrupted logical page may be the certain logical page or one of the at least one affected logical page. Stage 1266 may include reconstructing each corrupted page using the values of other pages of the XOR group and the XOR value.

Figure 13:
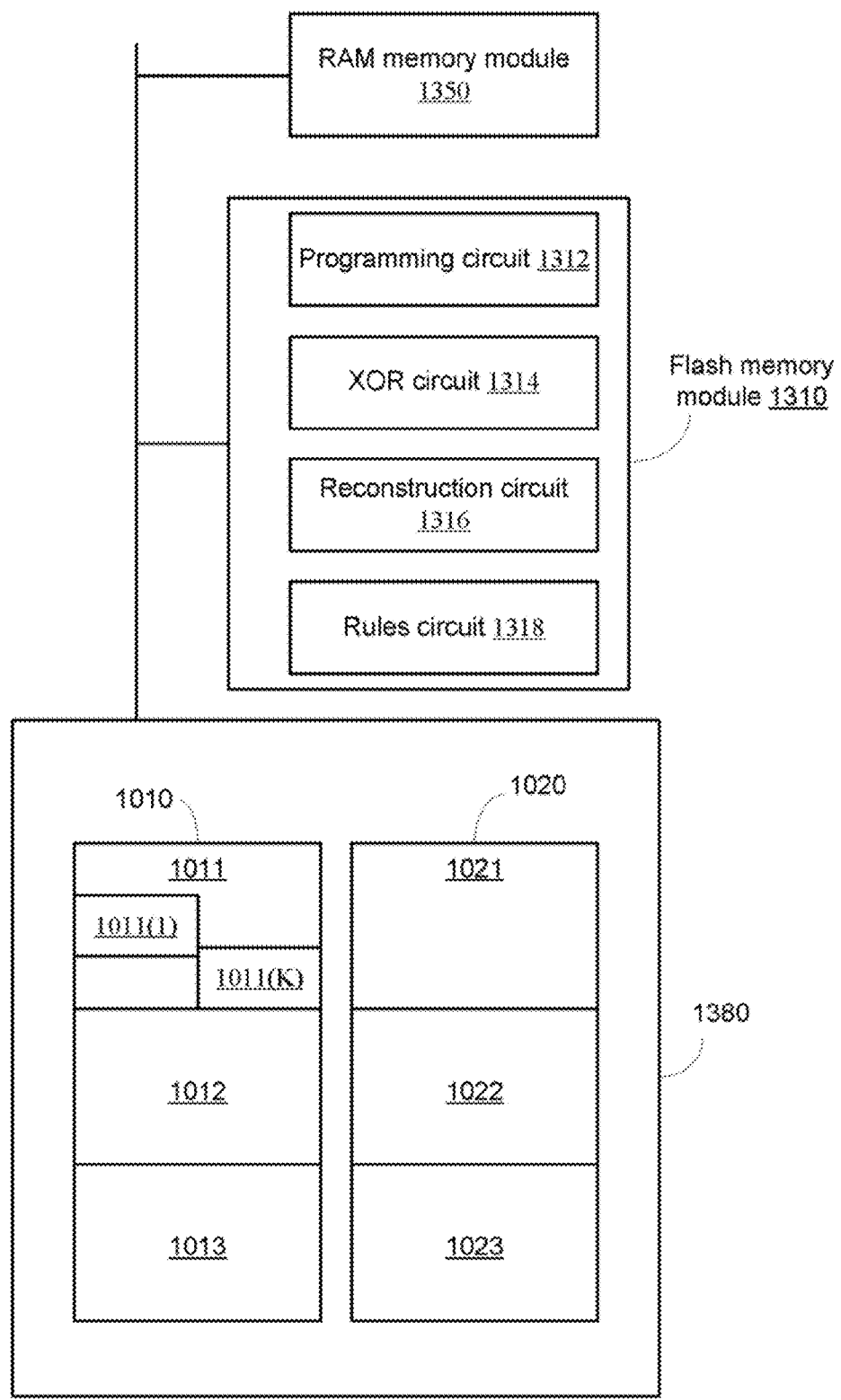
FIG. 13 illustrates a system according to an embodiment of the invention.

Additional embodiments of the invention include a system arranged to execute any or all of the methods described above, including any stages and any combinations of same. For example, FIG. 13 illustrates a system 1300 that includes a flash memory controller 1310, a volatile memory such as a RAM 1350 and a flash memory module 1380.

The flash memory controller 1310 may include a programming circuit 1312, a XOR circuit 1314, a reconstruction circuit 1316, and a rule circuit 1318.

The programming circuit 1312 may be arranged to program multiple logical pages to a flash memory module according to a programming order; wherein each logical page has a page number that reflects the programming order of the page; wherein the multiple logical pages comprise multiple groups of logical pages; wherein the multiple logical pages comprise logical pages of different types that differ from each other by significance.

The XOR circuit 1314 may be arranged to calculate a XOR value for each group of logical pages.

The programming circuit 1312 may also be arranged to store the XOR value of each group of logical pages at the flash memory module.

The reconstruction circuit 1316 may be arranged to use a XOR value of a group of logical pages to reconstruct a corrupted logical page of the group of logical pages.

The RAM 1350 may be arranged to store intermediate XOR results and may be arranged to store information to be programmed to the flash memory module 1380.

The rule circuit 1318 may be arranged to receive or determine rules relating to the programming order and, additionally or alternatively, to the grouping of logical pages to XOR groups. The rules can dictate, for example, that up to a single logical page of each group of logical pages is programmed to a each row of a flash memory die of the flash memory module and that logical page numbers of logical pages of a same type that belong to different groups of logical pages belong to non-overlapping numerical ranges.

The flash memory module 1380 can include one or more dies, and each die can include multiple blocks, each block may include multiple physical logical pages that may be mapped to a larger number of logical pages. FIG. 13 illustrates two flash memory dies 1010 and 1020, each include three erase blocks 1011-113 and 1021-1023, and also illustrates some physical pages such as 1011(1)-1011(k).

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for programming, comprising:
   programming multiple logical pages to a flash memory module according to a programming order, each logical page having a page number that reflects the programming order of the page, the multiple logical pages including multiple groups of logical pages, the multiple logical pages including logical pages of different types that differ from each other by significance;
   calculating a XOR value for each group of logical pages;
   storing the XOR value of each group of logical pages at the flash memory module; and
   using a XOR value of a group of logical pages to reconstruct a corrupted logical page of the group of logical pages;
      wherein up to a single logical page of each group of logical pages is programmed to a each row of a flash memory die of the flash memory module; and
   wherein logical page numbers of logical pages of a same type that belong to different groups of logical pages belong to non-overlapping numerical ranges.

2. The method of claim 1, comprising:
   detecting that a programming of a certain logical page failed or receiving an indication that the programming of the certain logical page failed; and
   finding at least one affected logical page that belongs to a same row as the certain logical page and that was programmed before the programming of the certain logical page failed; wherein the corrupted logical page is either one of the certain logical page or one of the at least one affected logical page.

3. The method of claim 1, wherein each group of logical pages comprises logical pages from each type of the different types of logical pages.

4. The method of claim 1, wherein each group of logical pages comprises only logical pages from a sub-set of types of the different types of logical pages.

5. The method of claim 1, wherein each group of logical pages comprises logical pages that have logical page numbers that form a consecutive sequence of logical page numbers.

6. The method of claim 1, wherein each group of logical pages comprises logical pages that have logical page numbers that form a non-consecutive sequence of logical page numbers.

7. The method of claim 1, wherein the multiple logical pages belong to different dies of the flash memory module that share same row numbers; wherein up to a single logical page of each group of logical pages is programmed to a page associated with a single row number.

8. The method of claim 7, different sets of logical pages that are associated to a same row number at different dice of the flash memory module share up to a single page number of a same value.

9. The method of claim 1, comprising programming multiple logical pages to multiple subsets of erase blocks of multiple flash memory dies or the flash memory module according to a programming order; wherein each subset of erase blocks share same row numbers and different subsets of erase blocks differ from each other by row numbers; wherein the programming comprises performing, in a serial manner, multiple programming sequences; wherein each programming sequence involves up to a single erase block out of each subset of erase blocks.

10. The method of claim 9, comprising maintaining a same programming order per erase block.

11. The method of claim 1, comprising receiving multiple information entities to be programmed to logical pages of different erase blocks of the flash memory module in an interleaved manner; wherein each group of logical pages comprises logical pages to be programmed in a continuous manner.

12. A non-transitory computer readable medium that stores instructions for:
programming multiple logical pages to a flash memory module according to a programming order, each logical page having a page number that reflects the programming order of the page, the multiple logical pages including multiple groups of logical pages, the multiple logical pages including logical pages of different types that differ from each other by significance;
calculating a XOR value for each group of logical pages;
storing the XOR value of each group of logical pages at the flash memory module; and
using a XOR value of a group of logical pages to reconstruct a corrupted logical page of the group of logical pages;
wherein up to a single logical page of each group of logical pages is programmed to a each row of a flash memory die of the flash memory module; and
wherein logical page numbers of logical pages of a same type that belong to different groups of logical pages belong to non-overlapping numerical ranges.

13. The non-transitory computer readable medium of claim 12, that is arranged to store instructions for:
detecting that a programming of a certain logical page failed or receiving an indication that the programming of the certain logical page failed; and
finding at least one affected logical page that belongs to a same row as the certain logical page and that was programmed before the programming of the certain logical page failed; wherein the corrupted logical page is either one of the certain logical page or one of the at least one affected logical page.

14. The non-transitory computer readable medium of claim 12, wherein each group of logical pages comprises logical pages from each type of the different types of logical pages.

15. The non-transitory computer readable medium of claim 12, wherein each group of logical pages comprises only logical pages from a sub-set of types of the different types of logical pages.

16. The non-transitory computer readable medium of claim 12, wherein each group of logical pages comprises logical pages that have logical page numbers that form a consecutive sequence of logical page numbers.

17. The non-transitory computer readable medium of claim 12, wherein each group of logical pages comprises logical pages that have logical page numbers that form a non-consecutive sequence of logical page numbers.

18. The non-transitory computer readable medium of claim 12, wherein the multiple logical pages belong to different dies of the flash memory module that share same row numbers; wherein up to a single logical page of each group of logical pages is programmed to a page associated with a single row number.

19. The non-transitory computer readable medium of claim 18, different sets of logical pages that are associated to a same row number at different dice of the flash memory module share up to a single page number of a same value.

20. The non-transitory computer readable medium of claim 12, that is arranged to store instructions for programming multiple logical pages to multiple subsets of erase blocks of multiple flash memory dies of the flash memory module according to a programming order; wherein each subset of erase blocks share same row numbers and different subsets of erase blocks differ from each other by row numbers; wherein the programming comprises performing, in a serial manner, multiple programming sequences; wherein each programming sequence involves up to a single erase block out of each subset of erase blocks.

21. The non-transitory computer readable medium of claim 20 that is arranged to store instructions for maintaining a same programming order per erase block.

22. The non-transitory computer readable medium of claim 12, that is arranged to store instructions for receiving multiple information entities to be programmed to logical pages of different erase blocks of the flash memory module in an interleaved manner; wherein each group of logical pages comprises logical pages to be programmed in a continuous manner.

23. A system having a flash memory controller, the flashing memory controller including a programming circuit arranged to program multiple logical pages to a flash memory module according to a programming order, each logical page having a page number that reflects the programming order of the page, the multiple logical pages including multiple groups of logical pages, the multiple logical pages including logical pages of different types that differ from each other by significance;
a XOR circuit arranged to calculate a XOR value for each group of logical pages;
wherein the programming module is arranged to store the XOR value of each group of logical pages at the flash memory module; and
wherein the flash controller comprises a reconstruction circuit that is arranged to use a XOR value of a group of logical pages to reconstruct a corrupted logical page of the group of logical pages;
wherein up to a single logical page of each group of logical pages is programmed to a each row of a flash memory die of the flash memory module; and
wherein logical page numbers of logical pages or a same type that belong to different groups of logical pages belong to non-overlapping numerical ranges.

24. The system of claim 23, wherein the flash memory controller comprises a reconstruction circuit that is arranged to receive an indication that the programming of the certain logical page failed; and find at least one affected logical page that belongs to a same row as the certain logical page and that was programmed before the programming of the certain logical page failed; wherein the corrupted logical page is either one of the certain logical page or one of the at least one affected logical page.

25. The system of claim 23, wherein the flash memory controller comprises a rules circuit that is arranged to define each group of logical pages as comprising logical pages from each type of the different types of logical pages.

26. The system of claim 23, wherein the flash memory controller comprises a rules circuit that is arranged to define each group of logical pages as comprising only logical pages from a sub-set of types of the different types of logical pages.

27. The system of claim 23, wherein the flash memory controller comprises a rules circuit that is arranged to define each group of logical pages as comprising logical pages that have logical page numbers that form a consecutive sequence of logical page numbers.

28. The system of claim 23, wherein the flash memory controller comprises a rules circuit that is arranged to define each group of logical pages as comprising logical pages that have logical page numbers that form a non-consecutive sequence of logical page numbers.

29. The system of claim 23, wherein the multiple logical pages belong to different dies of the flash memory module that share same row numbers; wherein the programming circuit is arranged to program up to a single logical page of each group of logical pages to a page associated with a single row number.

30. The system of claim 29, wherein the programming circuit is arranged to program different sets of logical pages that are associated to a same row number at different dice of the flash memory module so that the different sets of logical pages share up to a single page number of a same value.

31. The system of claim 23, wherein the programming circuit is arranged to program multiple logical pages to multiple subsets of erase blocks of multiple flash memory dies of the flash memory module according to a programming order; wherein each subset of erase blocks share same row numbers and different subsets of erase blocks differ from each other by row numbers; wherein the programming circuit is arranged to perform, in a serial manner, multiple programming sequences; wherein each programming sequence involves up to a single erase block out of each subset of erase blocks.

32. The system of claim 31 wherein the programming circuit is arranged to maintain a same programming order per erase block.

33. The system of claim 23, wherein the programming circuit is arranged to receive multiple information entities to be programmed to logical pages of different erase blocks of the flash memory module in an interleaved manner; wherein each group of logical pages comprises logical pages to be programmed in a continuous manner.

* * * * *